United States Patent
Marshall et al.

(10) Patent No.: US 6,367,261 B1
(45) Date of Patent: Apr. 9, 2002

(54) THERMOELECTRIC POWER GENERATOR AND METHOD OF GENERATING THERMOELECTRIC POWER IN A STEAM POWER CYCLE UTILIZING LATENT STEAM HEAT

(75) Inventors: Daniel S. Marshall, Chandler; Jerald A. Hallmark, Gilbert; William J. Ooms, Prescott, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/703,072

(22) Filed: Oct. 30, 2000

(51) Int. Cl.$^7$ ............................................... F01K 17/00
(52) U.S. Cl. ................................... 60/670; 60/690
(58) Field of Search .................... 60/670, 677, 679, 60/685, 690

(56) References Cited

U.S. PATENT DOCUMENTS 4,494,380 A * 1/1985 Cross ............................... 62/3
4,790,650 A * 12/1988 Keady .......................... 356/37
5,457,983 A * 10/1995 Sauvageau et al. .......... 73/1 G

* cited by examiner

Primary Examiner—Hoang Nguyen
(74) Attorney, Agent, or Firm—William E. Koch

(57) ABSTRACT

A thermoelectric power generator and method of generating thermoelectric power in a steam power cycle utilizing latent steam heat including a condenser, a heat source, such as steam, and at least one thermoelectric module. The condenser includes a plurality of condenser tubes each having included therein a heat extractor. The heat source is in communication with the condenser and is characterized as providing thermal energy to the condenser. The at least one thermoelectric module, including a plurality of thermoelectric elements, is positioned in communication with at least one of the plurality of condenser tubes so that thermal energy flows through the thermoelectric elements thereby generating electrical power.

23 Claims, 3 Drawing Sheets

THERMOELECTRIC POWER GENERATOR AND METHOD OF GENERATING THERMOELECTRIC POWER IN A STEAM POWER CYCLE UTILIZING LATENT STEAM HEAT

FIELD OF THE INVENTION

The present invention relates to thermoelectric power generation in a steam power cycle and a method of generating thermoelectric power in a steam power cycle utilizing latent steam heat.

BACKGROUND OF THE INVENTION

Steam power plants, including those run by coal, nuclear power, and other fossil fuels, typically generate electricity while achieving a 30–35% overall fuel to power efficiency. A typical steam power plant, described herein as a steam power cycle, includes a steam turbine and a source of steam. In addition, included is a condenser, which serves as an indirect heat exchanger. During operation, steam passes into one section of the heat exchanger. Coolant, typically water, enclosed within metal tubing, separates the condensing steam from the coolant. During the process of condensing the steam, the coolant water is heated in the condenser by the latent heat of the steam and cooled in a cooling tower or other heat sink. The coolant, or water, passes between the condenser, where it absorbs heat, and a cooling tower, where it gives up heat. The condensed steam remains separate from the circulating water and is reheated to provide a source of steam to drive turbines. Therefore, simply stated, high pressure steam is made in a boiler, the pressure and temperature of the steam are reduced in the turbine thereby generating power, and the steam is condensed in the condenser. During the process, the latent heat of condensation is transferred to the cooling water by the condenser and is rejected by the cooling towers. It is estimated that during this process almost 60% of the heat energy from the fuel is lost as latent heat of condensation.

It is proposed to incorporate thermoelectric modules to aid in this conversion of latent heat to power, thereby decreasing the loss of heat during the process, and increasing the efficiency of the power cycle, or power plant. Thermoelectric modules, when serving as power generators, operate by tapping into heat available from a warm body or warm flow and transferring it to a cool body or cool flow. In transferring heat through the thermoelectric modules, electrical power is generated by the Seebeck effect in the material that composes the modules. Typically a thermoelectric device is constructed of an N-type and P-type semiconductor material, such as bismuth telluride. The N-type and P-type semiconductor material are electrically connected in series and thermally connected in parallel. When heat is passed through the material, electricity is generated between the N-type and P-type semiconductor material.

Accordingly, to overcome these problems, it is a purpose of the present invention to provide for a thermoelectric power generator for the capture of latent heat generated by a steam power cycle, thereby increasing the power output of the steam power cycle.

It is another purpose of the present invention to provide for a thermoelectric power generator for the thermoelectric converting of latent steam heat into electricity.

It is yet another purpose of the present invention to provide for a thermoelectric power generator having included as a part thereof thermoelectric modules for the generation of electrical power from latent steam heat.

It is still another purpose of the present invention to provide for a thermoelectric power generator including at least one thermoelectric module mounted to a condenser tube.

It is a still further purpose of the present invention to provide for a method of generating thermoelectric power by thermoelectrically converting latent steam heat into electricity.

It is still a further purpose of the present invention to provide for a method of generating thermoelectric power by converting latent steam heat into electricity utilizing at least one thermoelectric device mounted adjacent a condenser tube.

It is still a further purpose of the present invention to provide for a method of generating thermoelectric power including the use of at least one thermoelectric module that advantageously utilizes heat flux generated within a steam power cycle to generate electricity.

SUMMARY OF THE INVENTION

These needs and others are substantially met through provision of a thermoelectric power generator including at least one thermoelectric module mounted adjacent a condenser tube. The thermoelectric module is characterized as utilizing latent heat to increase the power output of a steam power plant. Power, and more particularly, electrical energy generated by the thermoelectric module is added to the total electrical energy generated by the power cycle.

In addition, disclosed is a method of generating thermoelectric power from latent heat produced in a steam power cycle, by mounting at least one thermoelectric module adjacent a condenser tube to produce electrical energy from latent heat.

DETAILED DESCRIPTION OF THE INVENTION

During the course of this description, like numbers are used to identify like elements according to the different figures that illustrate the invention. Thermoelectric devices are known in the art which offer considerable flexibility, in amongst other things, power generation. Thermoelectric modules, when serving as power generators, operate by tapping into heat available from a warm body or flow and transferring it to a cool body or flow. In transferring heat through the thermoelectric modules, electrical power is generated by the Seebeck effect in the material that composes the modules. Typically a thermoelectric device is constructed of an N-type and P-type semiconductor material, such as bismuth telluride. The N-type and P-type semiconductor material are electrically connected in series and thermally connected in parallel. When heat is passed through the material, electricity is generated between the N-type and P-type semiconductor material.

A preferred embodiment of a thermoelectric power generator and method of thermoelectric conversion utilizing latent steam heat, operates similar to the typical steam power plant as we know them today, except in this particular disclosure, latent steam heat generated in the condenser of a steam power plant is utilized in conjunction with thermoelectric modules to generate additional electrical power. By mounting thermoelectric modules adjacent condenser cooling tubes or coils, a substantial temperature difference is detected and thus heat flux can be forced through the thermoelectric modules, therefore generating additional electrical energy for the power plant. This arrangement will allow the thermoelectric modules to produce electrical power that could supplement the power presently generated by typical power plants or steam power cycles. This method of producing power could produce hundreds of megawatts of power. Factors involved in positioning the thermoelectric modules within the condenser include: modifying the thermal conductance of the condenser tubes using the thermoelectric modules so as to increase the temperature of the steam entering the condenser above the typical temperature of 33° C.; the low temperature of the cooling water (approximately 28° C.); the number of condenser tubes including thermoelectric modules to transfer the latent heat flux; the reliability of the thermoelectric modules; and the fact that more heat will be pumped into the hot side of the thermoelectric modules, than out of the cold side. Therefore, proper choice of thermoelectric material and positioning or mounting of the thermoelectric module provides for the achievement of near optimum design in the generation of electrical power.

Figure 1:
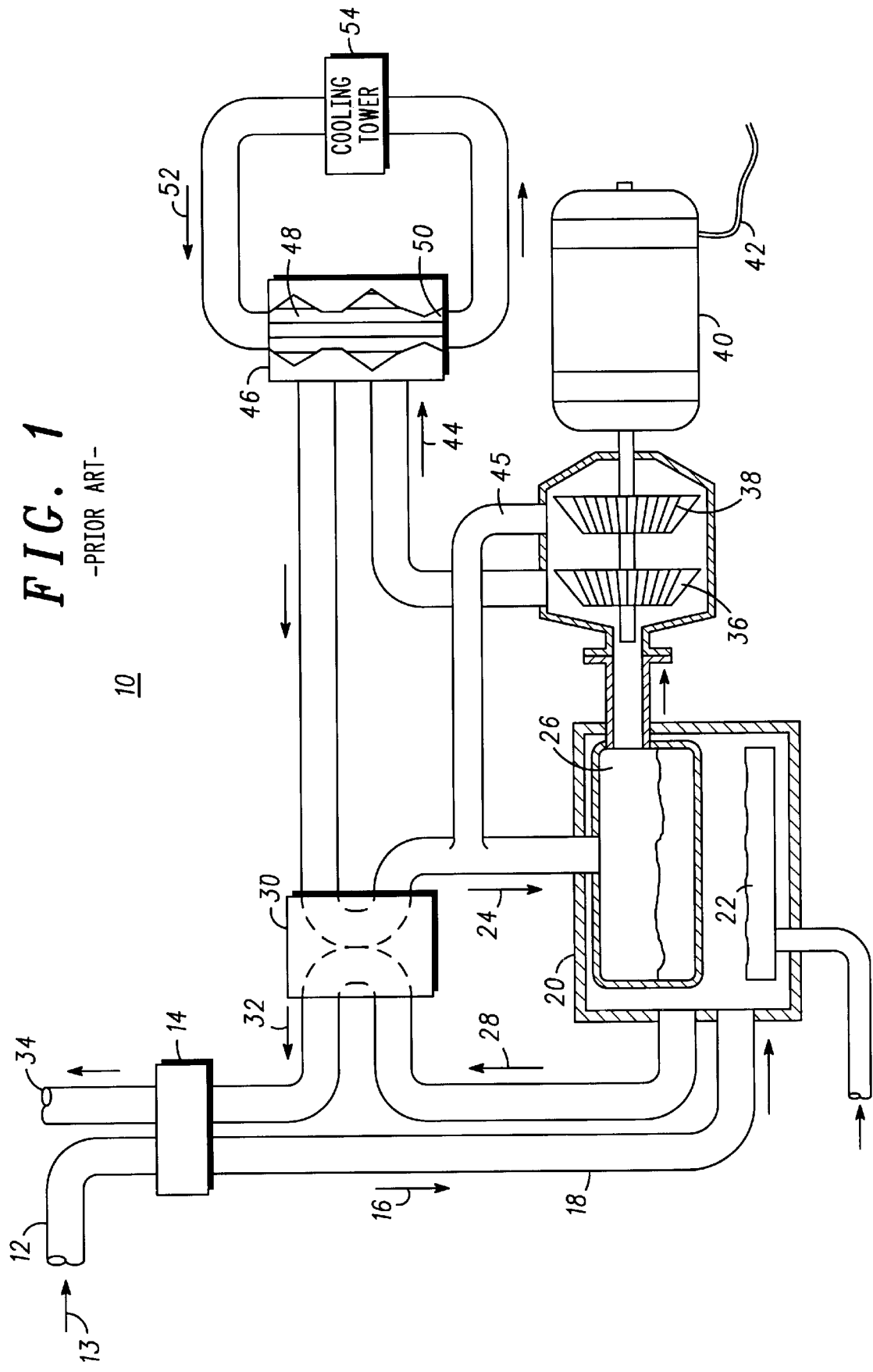
FIG. 1 illustrates a simplified prior art embodiment of a power generator and more particularly, a steam power cycle.

Referring now to FIG. 1, illustrated is a prior art embodiment of a power generator and method of generating power in a steam power cycle. As illustrated in FIG. 1, provided is a simplified power generator 10, typical of today's steam power plants. Power generator 10, as illustrated, includes a cold air inlet 12, for intake of air into power generator 10, an in particular the steam power cycle. Cold air 13 entering through cold air inlet 12 is pre-heated in an air-to-air heat exchanger 14 utilizing heat from heat exhaust (discussed presently) Resultant pre-heated air 16 next travels through a conduit 18 to a heater 20, such as a boiler, that is fueled by coal 22, or some other type of fuel component. Pre-heated air 16 is further heated in heater 20 by burning the mixture of fuel and air in the boiler, thereby heating inlet pre-heated water 24 to produce outlet steam 26. Excess heat exhaust 28 exits heater 20, passing through an economizer 30 which serves to further cool heat exhaust 28 prior to exiting through a steam power stack 34. It should be understood that heat exhaust 28 typically exits heater 20 at a temperature of approximately 300° C. and is further cooled by economizer 30, exiting as exhaust air 32 at a temperature of approximately 125° C. Air-to-air heat exchanger 14 then further cools exhaust air 32 to a temperature of approximately 80° C. During this process, heat extracted by economizer 30 is utilized to heat water exiting the condenser (discussed presently) producing inlet pre-heated water 24. Similarly, heat extracted by air-to-air heat exchanger 14 is utilized to heat cool inlet air 12, producing pre-heated air 16.

Next, outlet steam 26, having a temperature of approximately 565° C., exits heater 20 and enters a series of turbines. Illustrated in this particular embodiment are a first turbine 36 and a second turbine 38 turning a generator 40. Turbines 36 and 38 generate power 42 from high pressure steam 26. It should be understood that a fewer or a greater number of turbines can be utilized for generating power 42 as well as the removing of stages of blades (not shown) from at least one of the turbines 36 or 38, to create steam at a higher temperature and pressure. During operation, residual steam, characterized as low pressure steam 44, is channeled toward a condenser 46 including a plurality of condensing tubes 48. It should be understood that a small percentage of steam 45 is channeled back in a loop and becomes a part of pre-heated water 24. Condenser 46 serves to condense low pressure steam 44, which exits turbines 36 and 38 at a temperature of approximately 33° C., to water 50.

Condenser 46 operates by recirculating within condenser tubes 48, a heat extractor 52, more particularly, cooling water. Heat extractor 52 enters condenser tubes 48 at a temperature of less than that of low pressure steam 44 entering condenser 46. Heat extractor 52 exits condenser 46 at a temperature that is slightly elevated from the input temperature, but still less than that of low pressure steam 44. Heat extractor 52 recirculates through the plurality of condenser tubes 48 by way of a cooling tower 54. During this process of cooling low pressure steam 44, latent heat from the condensation of low pressure steam 44 is lost through condenser 46 and cooling tower 54, thereby creating an overall approximate 30–35% fuel to power efficiency of steam power cycle.

Once condensed water SO is collected in condenser 46, it is recirculated back to economizer 30, which as previously described, pre-heats in-let water 24 prior to mixing with steam 45. Steam 45 mixing with inlet water 24, condenses and becomes part of inlet water 24 flow and in the process of condensing further heats inlet water flow 24 prior to introduction into boiler 20.

As previously stated, power generator 10 is a simplified embodiment of what is presently available. As presented, a great degree of inefficiency is present in that a great portion of generated heat is lost during the cycle. More particularly, latent heat of condensation is lost by the condenser 46 and rejected by the cooling towers 54. This heat flux can, as presented herein, be converted into additional power output for the steam power cycle, and more particularly for power generator 10, through the use of thermoelectric modules (discussed presently).

Figure 2:
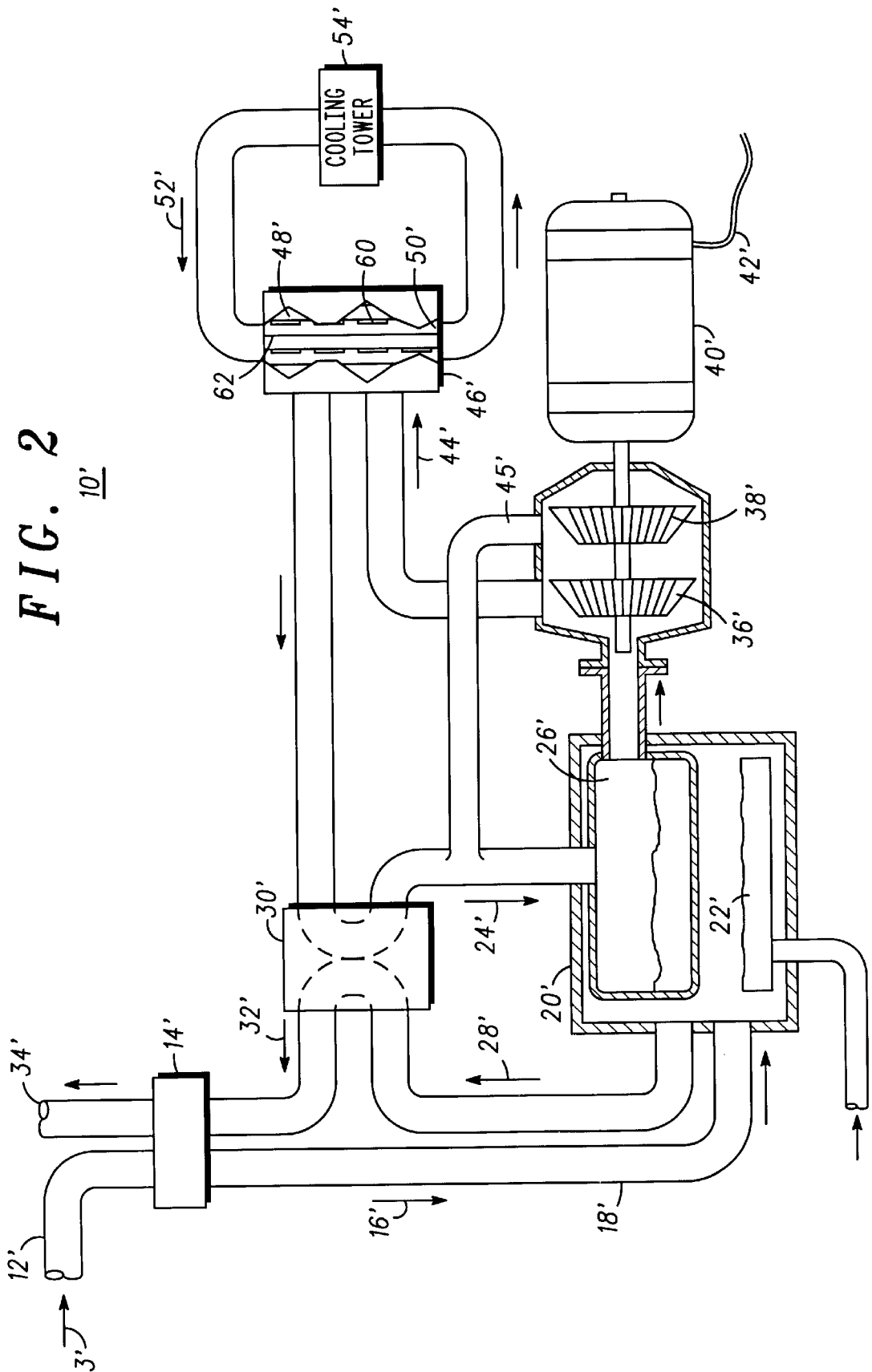
FIG. 2 illustrates a simplified thermoelectric power generator and method of generating thermoelectric power from latent heat in a steam power cycle according to the present invention.

Referring now to FIG. 2, illustrated is a steam power generator, referenced 10', generally similar to steam power generator 10, described with reference to FIG. 1. It should be noted that all components of the prior art embodiment, as illustrated in FIG. 1, that are similar to components of this particular inventive embodiment as illustrated in FIG. 2, are designated with similar numbers, having a prime added to indicate the different embodiments. Accordingly, steam power cycle 10', as illustrated includes a boiler 20', an air-to-air heat exchanger 14', an economizer 30', dual turbines 36' and 38', a condenser 46', a cooling tower 54', as well as other components described in detail with respect to FIG. 1. In this particular embodiment, condenser 46' includes a plurality of condenser tubes 48' having positioned adjacent thereto, at least one thermoelectric module 60. It should be understood that in this particular embodiment, a plurality of thermoelectric modules 60 are illustrated adjacent the plurality of condenser tubes 48'. The specific number of thermoelectric modules 60 required is dependent upon the desired additional power output and the thermoelectric efficiency and thermal conductance of thermoelectric modules 60. Condenser 46' having included as a part thereof thermoelectric modules 60, will enable the capture of a portion of the latent heat that was described as being lost in the prior art embodiment described with respect to FIG. 1. This capture of latent heat will enable the power output of steam power generator 10' to be increased, thus leading to a more efficient steam power cycle.

Figure 3:
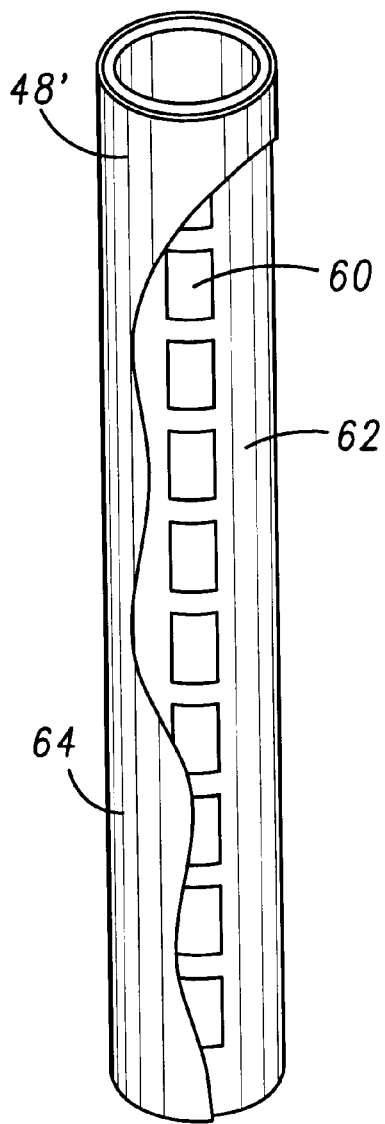
FIG. 3 illustrates in simplified cut-away view a single condenser tube, having positioned adjacent thereto a plurality of thermoelectric modules according to the present invention.
Figure 4:
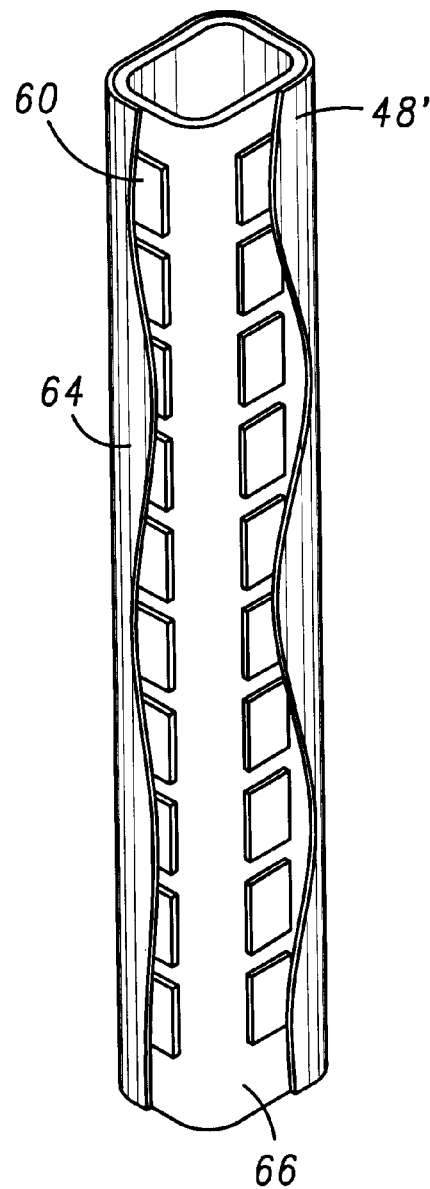
FIG. 4 illustrates a cut-away simplified view of single condenser tube, having positioned adjacent thereto a plurality of thermoelectric modules.

It should be understood that although the plurality of thermoelectric modules 60 are illustrated as being positioned adjacent the plurality of condenser tubes 48', that modules 60 can be positioned in the alternative, within an interior aspect of condenser tubes 48' (described presently with respect to FIG. 3), or positioned on the exterior surface of condenser tubes 48' but within an outer shell covering (described presently with respect to FIG. 4).

To utilize thermoelectric modules 60, a temperature difference is required. One way to achieve this temperature difference is to allow the temperature and pressure of the output steam 44' from the last turbine 38' to rise. This can be done by removing some stages from turbine 38' and designing the condenser 46', including thermoelectric modules 60 adjacent the condenser tubes 48', to have a lower overall thermal conductance than in condenser 46 of FIG. 1. It should be understood that the power generated by generator 40' will decrease as a result of increasing the temperature and pressure of output steam 44'. It should also be understood that the resulting power increase in condenser 46' can compensate and exceed this lost power if the efficiency of thermoelectric modules 60 is high enough.

Recent developments in advanced thermoelectric structures have made efficiencies in excess of 50% of the Carnot efficiency possible. These devices would make possible a nearly 10% increase in power output for steam power generator 10'. In a preferred embodiment, thermoelectric module 60 includes one of silicon, boron carbide, a silicon/germanium alloy, geranium, or skutterudite which optionally includes a quantum well structure.

One simple design for a thermoelectric condenser tube 48', is to simply mount a plurality of thermoelectric modules 60 on the exterior surface, or wall, 62 of condenser tube 48', as illustrated in FIG. 2. Thermoelectric modules 60 would then be connected electrically in series or parallel dependent upon device design.

In alternative designs, as illustrated in FIGS. 3 and 4, thermoelectric modules 60 are positioned, as is illustrated in FIG. 3, on exterior surface 62 of condenser tube 48', and enclosed within an outer shell, or covering 64, so as to protect thermoelectric modules 60 from steam input 44'. Alternatively, and as illustrated in FIG. 4, dependent upon the specific heat extractor 52' utilized within condenser tubes 48', thermoelectric modules 60 can be positioned on an interior surface, or wall, 66 of condenser tubes 48'.

Of concern in the manufacture of condenser tubes 48', having positioned adjacent thereto thermoelectric modules 60 is the achievement of efficient heat transfer from steam 44' to the thermoelectric module surface. In modern condensers, the area of condenser tube 48' is simply increased until the inefficiencies induced by a water film build-up on the surface of thermoelectric module 60 are overcome by increased surface area. Due to price sensitivity with respect to condensers including thermoelectric modules, and due to the scaling of cost dependent upon the thermoelectric surface area, two solutions are disclosed. First, concentrating the heat from the steam condensation is proposed. This can be achieved by either increasing the condensation area while directing the heat to a relatively small thermoelectric module area, or forcefully disrupting the water film boundary layer with sprayed water in the condenser so that more efficient heat transfer to the thermoelectric condensing surface can take place. This will effectively increase the condensing surface area since the water droplets in the water spray will also condense steam 44' and then transfer that heat to the thermoelectric module surface as well.

As disclosed in this invention, thermoelectric modules 60 are positioned adjacent condenser tubes 48'. While it is disclosed that at least one thermoelectric module 60 be utilized, preferably a plurality of thermoelectric modules, as illustrated in FIG. 2 are utilized, each including a plurality of thermoelectric elements. Thermoelectric modules 60 operate by tapping into the excess heat available from low pressure steam 44' and transferring it to the heat extractor 52' enclosed within condenser tubes 48'. In the transferring of the heat through the thermoelectric modules 60, electrical power is generated in the material that composes the modules 60 by the Seebeck effect. Traditionally, the Seebeck effect is defined as the ability to convert a temperature gradient from thermal energy into electrical voltage. By tapping into this voltage, electrical energy can be provided by the thermoelectric modules 60. This ability to convert latent heat into electrical power provides for a greater power efficiency in steam power generator 10'.

Quantum structures have demonstrated higher thermoelectric performance, including higher efficiency, than traditional bulk materials. Quantum structures include compositional or doping variations smaller than approximately 100 angstroms. In this application, efficiency is extremely important and quantum structures designed for this application must be durable enough to remain intact after many hours at elevated temperatures. Therefore it is our intention to design these modules and quantum wells from materials where they can reliably be subjected to the temperature extremes in this application for many hours.

As stated, thermoelectric modules 60 operate by condensing the low pressure steam 44' and transferring the latent heat via thermoelectric modules 60 to heat extractor 52'. This heat extractor 52' may be represented by cooled water, a cool fuel flow, or a cool oxidant flow, that may include vaporizing the fuel or oxidant from its liquid state to a gaseous state. In addition, this heat extractor may be represented by a cold radiation sink.

During operation, electricity is generated by thermoelectric modules 60. This electricity is generally fed into a power conditioning circuit which conditions the power, and in effect modifies the voltage and current to a preset, smooth level, an alternating voltage level to be utilized for example in driving a DC motor attached to the generator or to create a magnetic field in the standard generator, or supplied in a variable manner to drive the electrical load placed on the circuit. The output of this power conditioning circuit then provides electrical power.

According to this disclosure, what is sought to be achieved is a means for generating additional electrical power through the use of latent heat generated in a steam power cycle by including thermoelectric modules capable of generating electricity in response to heat flux. With the inclusion of thermoelectric modules, a more efficient means of generating power is disclosed. The thermoelectric modules are positioned to maximize the benefit of the latent heat and the condenser utilizing the Seebeck effect in the material that composes the thermoelectric modules. It is disclosed that various positions exist for mounting or including the thermoelectric modules in conjunction with the condenser and more particularly the condenser tubes, such instances are intended to be covered by this disclosure.

What is claimed is:

1. A thermoelectric power generator for a steam power cycle comprising:
 a condenser, including a plurality of condenser tubes having included therein each of the plurality of condenser tubes a heat extractor;
 a steam source, the steam source characterized as providing thermal energy to the condenser; and
 at least one thermoelectric module, including at least one thermoelectric element, positioned in communication with at least one of the plurality of condenser tubes so that thermal energy flows through the thermoelectric elements thereby generating electrical power.

2. A thermoelectric power generator for a steam power cycle as claimed in claim 1 wherein the heat extractor includes at least one of a fuel flow, an oxidant flow, a liquid flow, a gas flow, and a cold radiation sink.

3. A thermoelectric power generator for a steam power cycle as claimed in claim 2 wherein the heat extractor is water.

4. A thermoelectric power generator for a steam power cycle as claimed in claim 1 wherein the steam source includes a means for spraying condensed steam onto the surface of the at least one of the plurality of condenser tubes, thereby forcefully disrupting the water film boundary layer of condensed steam on the surface of the at least one of the plurality of condenser tubes and increasing the thermal energy provided by the steam to the at least one thermoelectric module.

5. A thermoelectric power generator for a steam power cycle as claimed in claim 1 wherein the at least one thermoelectric module is positioned to provide for exposure to the steam source and the heat extractor.

6. A thermoelectric power generator for a steam power cycle as claimed in claim 5 wherein the at least one thermoelectric module is positioned on an exterior surface of at least one of the condenser tubes thereby characterized as having direct exposure to the steam source, and indirect exposure to the heat extractor.

7. A thermoelectric power generator for a steam power cycle as claimed in claim 5 wherein the at least one thermoelectric module is positioned on an interior surface of at least one of the condenser tubes, thereby characterized as having indirect exposure to the steam source, and direct exposure to the heat extractor.

8. A thermoelectric power generator for a steam power cycle comprising:
 a condenser, including a plurality of condenser tubes having included therein each of the plurality of condenser tubes a heat extractor;
 a steam source, the steam source characterized as providing thermal energy to the condenser; and
 at least one thermoelectric module, including a plurality of thermoelectric elements, positioned in communication with at least one of the plurality of condenser tubes thereby providing for exposure to the steam heat source and the heat extractor so that thermal energy flows through the thermoelectric elements, thus generating electrical power.

9. A thermoelectric power generator for a steam power cycle as claimed in claim 8 wherein the heat extractor is at least one of a ducted air flow, a liquid flow, a fuel, an oxidant, a cryogenic liquid, a cryogenic gas, a cold gas flow, and ambient air.

10. A thermoelectric power generator for a steam power cycle as claimed in claim 8 wherein the at least one thermoelectric module includes one of silicon, silicon germanium alloy, germanium, skutterudite, boride, and boron carbide.

11. A thermoelectric power generator for a steam power cycle as claimed in claim 8 wherein the at least one thermoelectric module is positioned on an exterior surface of at least one of the condenser tubes thereby characterized as having direct exposure to the steam source, and indirect exposure to the heat extractor.

12. A thermoelectric power generator for a steam power cycle as claimed in claim 8 wherein the at least one thermoelectric module is positioned on an interior surface of at least one of the condenser tubes, thereby characterized as having indirect exposure to the steam source, and direct exposure to the heat extractor.

13. A thermoelectric power generator for a steam power cycle as claimed in claim 8 wherein the steam source includes a means for spraying condensed steam onto the surface of the at least one of the plurality of condenser tubes, thereby forcefully disrupting the water film boundary layer of condensed steam on the surface of the at least one of the plurality of condenser tubes and increasing the thermal energy provided by the steam to the at least one thermoelectric module including a plurality of thermoelectric elements.

14. A method of generating thermoelectric power in a steam power cycle comprising the steps of:
 providing a condenser, including a plurality of condenser tubes having included therein each of the plurality of condenser tubes a heat extractor;
 providing a heat source, the heat source characterized as providing thermal energy to the condenser;
 positioning at least one thermoelectric module, including a plurality of thermoelectric elements, in communication with at least one of the plurality of condenser tubes so that thermal energy flows through the thermoelectric elements thereby generating electrical power; and
 utilizing power generated by the at least one thermoelectric module to increase power output of the steam power plant.

15. A method of generating thermoelectric power in a steam power cycle as claimed in claim 14 wherein the step of providing a heat source includes providing a steam source.

16. A method of generating thermoelectric power in a steam power cycle as claimed in claim 15 wherein the step of providing a steam source includes removing stages of blades from at least one of the turbines to provide steam at a higher temperature and pressure.

17. A method of generating thermoelectric power in a steam power cycle as claimed in claim 15 wherein the step of providing a steam source includes spraying condensed steam onto the surface of the at least one of the plurality of condenser tubes, thereby forcefully disrupting the water film boundary layer of condensed steam on the surface of the at least one of the plurality of condenser tubes and increasing the thermal energy provided by the steam to the at least one thermoelectric module.

18. A method of generating thermoelectric power in a steam power cycle as claimed in claim 14 wherein the step of providing a heat extractor includes providing at least one of a fuel, an oxidant, a liquid, a cryogenic liquid, a liquid flow, a gas flow, or a cold radiation sink.

19. A method of generating thermoelectric power in a steam power cycle as claimed in claim 14 wherein the step of providing a heat extractor includes providing a liquid that vaporizes as thermal energy is supplied.

20. A method of generating thermoelectric power in a steam power cycle as claimed in claim 14 wherein the step of positioning at least one thermoelectric module in communication with at least one of the plurality of condenser tubes includes positioning the thermoelectric module to provide for exposure to the heat source and the heat extractor.

21. A method of generating thermoelectric power in a steam power cycle as claimed in claim 20 wherein the step of positioning at least one thermoelectric module in communication with at least one of the plurality of condenser tubes includes positioning the thermoelectric module on an exterior surface of at least one of the condenser tubes thereby the thermoelectric module characterized as having direct exposure to the heat source, and indirect exposure to the heat extractor.

22. A method of generating thermoelectric power in a steam power cycle as claimed in claim 20 wherein the step of positioning the at least one thermoelectric module in communication with at least one of the plurality of condenser tubes includes positioning the thermoelectric module on an interior surface of at least one of the condenser tubes, thereby the thermoelectric module characterized as having indirect exposure to the heat source, and direct exposure to the heat extractor.

23. A method of generating thermoelectric power in a steam power cycle as claimed in claim 14 wherein the step of providing a condenser, including a plurality of condenser tubes and the step of positioning at least one thermoelectric module, including a plurality of thermoelectric elements, in communication with at least one of the plurality of condenser tubes includes optimizing the number of condenser tubes with thermoelectric modules to decrease the thermal conductance of the condenser tubes, causing the temperature of the steam in the condenser to increase.

\* \* \* \* \*